United States Patent
Springer et al.

(10) Patent No.: US 7,562,315 B2
(45) Date of Patent: Jul. 14, 2009

(54) EDGE RECOGNITION BASED HIGH VOLTAGE PSEUDO LAYER VERIFICATION METHODOLOGY FOR MIX SIGNAL DESIGN LAYOUT

(75) Inventors: Lily X. Springer, Dallas, TX (US); Haim Horovitz, Los Altos, CA (US); Robert Graham Shaw, Jr., Nashua, NH (US); Sameer Pendharkar, Allen, TX (US); Wen-Hwa M. Chu, Plano, TX (US); Paul C. Mannas, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 491 days.

(21) Appl. No.: 11/199,337

(22) Filed: Aug. 8, 2005

(65) Prior Publication Data

US 2007/0033556 A1 Feb. 8, 2007

(51) Int. Cl.
*G06F 17/50* (2006.01)
(52) U.S. Cl. ............................................. 716/1; 716/4

(58) Field of Classification Search ........................ 716/5, 716/1, 4
See application file for complete search history.

(56) References Cited

U.S. PATENT DOCUMENTS

| | | | | |
|---|---|---|---|---|
| 6,117,179 | A * | 9/2000 | Tan et al. | 703/14 |
| 6,735,749 | B2 * | 5/2004 | Li et al. | 716/5 |
| 6,832,360 | B2 * | 12/2004 | Li | 716/5 |
| 6,871,332 | B2 * | 3/2005 | Li et al. | 716/5 |

\* cited by examiner

*Primary Examiner*—Vuthe Siek
*Assistant Examiner*—Brandon W Bowers
(74) *Attorney, Agent, or Firm*—Warren L. Franz; Wade J. Brady, III; Frederick J. Telecky, Jr.

(57) ABSTRACT

Validation of at least some of a proposed semiconductor design layout is disclosed. According to one or more aspects of the present invention, a first voltage dependent design rule is applied to an edge of an area of the layout if the edge is not covered by a pseudo layer. A second voltage dependent design rule is, on the other hand, applied to the edge of the area if the edge is covered by the pseudo layer.

17 Claims, 4 Drawing Sheets

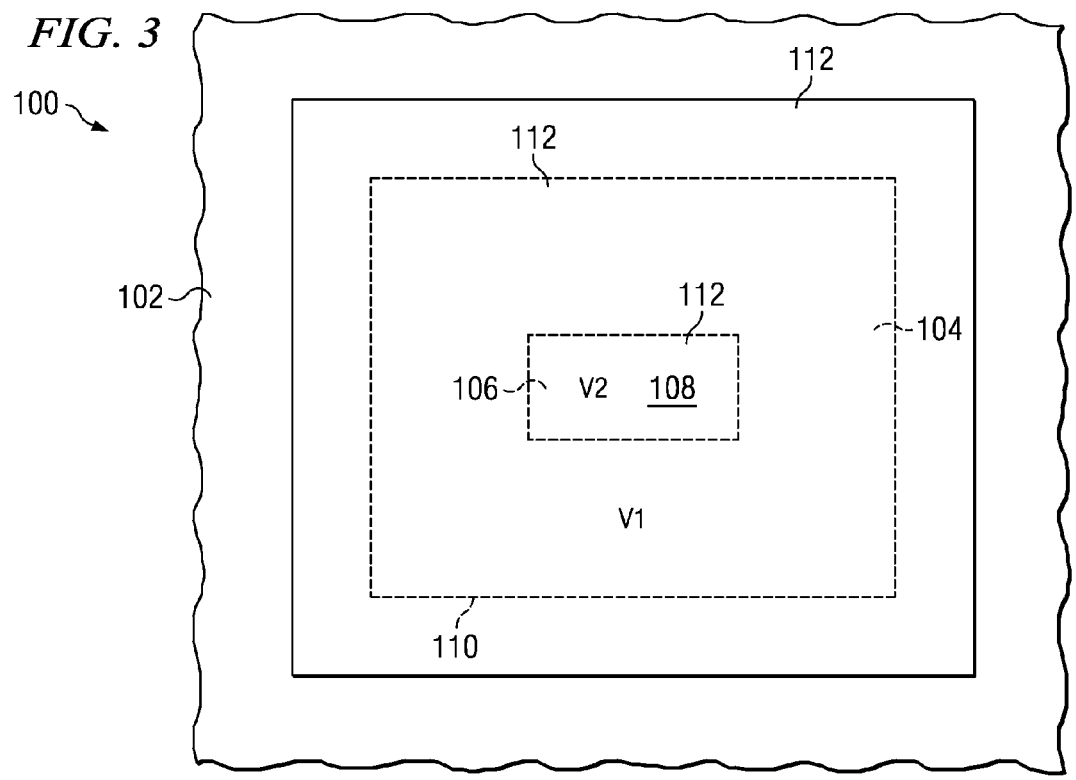
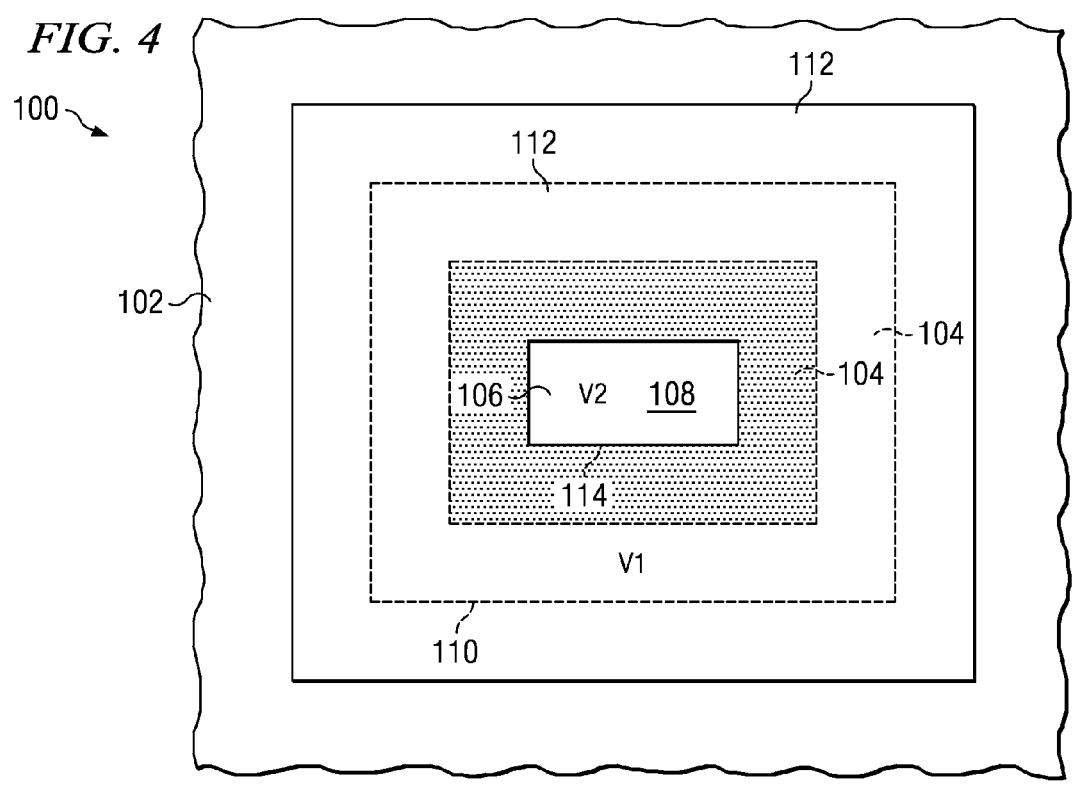

US 7,562,315 B2

EDGE RECOGNITION BASED HIGH VOLTAGE PSEUDO LAYER VERIFICATION METHODOLOGY FOR MIX SIGNAL DESIGN LAYOUT

FIELD OF INVENTION

The present invention relates generally to semiconductor fabrication, and more particularly to voltage rule verification in design layout.

BACKGROUND OF THE INVENTION

It can be appreciated that different areas of semiconductor devices can. operate at different voltage levels. For example, in a mixed signal design an isolated p well and an n isolation ring may operate at voltages different from that of the global substrate, for example. Accordingly, it can be appreciated that it is important to test the different areas to see if they comply with respective voltage rules. Such voltage rules are generally implemented in software that is applied to a proposed design layout. Stated another way, a proposed layout (e.g., for a mixed signal circuit) is run through certain voltage dependent design rule software whereby a 'red flag' is raised if certain voltage rule requirements are not met or certain voltage rules are otherwise violated.

Nevertheless, conventional schemes for applying voltage rules to different areas of a proposed semiconductor circuit design do not address the interfaces of different areas. This can result in edges of areas being tested under less than adequate voltage rules. Accordingly, it would be desirable to provide a scheme that applies appropriate voltage design rules to area edges.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to the application of voltage rules to proposed circuit design layouts. According to one or more aspects of the present invention, voltage rules are applied in one or more manners to account for issues that may be encountered at the interface of different areas, and more particularly at the edges of the areas. In accordance with one or more aspects of the present invention, area edges are subject to certain voltage rules when the edges are covered by a so called 'pseudo layer'. Conversely, the edges are validated by different (e.g., default) design rules when the edges are not covered by a pseudo layer. The pseudo layer is, accordingly, not a real layer, but is instead merely a mechanism (e.g., software coding) for deciding which voltage rules to apply to area edges.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 3 is a schematic diagram illustrating another application of a verification methodology according to one or more aspects of the present invention wherein outer edges of an area are subjected to a second voltage rule since the entire area is covered by a pseudo layer.

FIG. 4 is a schematic diagram illustrating an arrangement wherein less than all of an area is covered by a pseudo layer, but outer edges of that area are all covered by the pseudo layer so that the edges are subjected to a second voltage rule according to one or more aspects of the present invention.

DETAILED DESCRIPTION OF THE INVENTION

Figure 1:
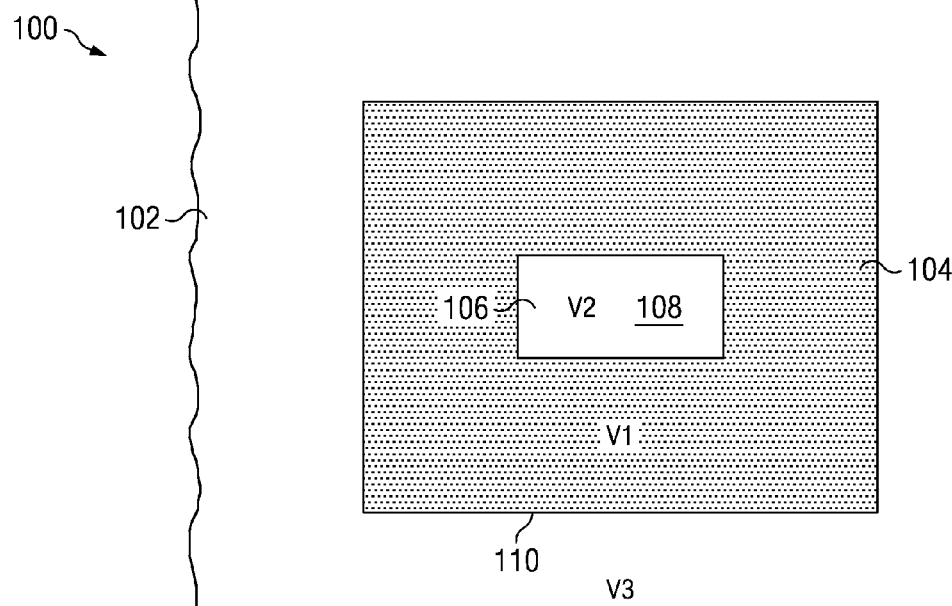
FIG. 1 is a schematic diagram illustrating at least part of an exemplary layout for a circuit design wherein different areas may be operated at different voltages availing themselves to different voltage design rules, and wherein respective rules should be applied to an area and its edges due to the fact that the area, and more particularly its edges, abut another area that is operated at a different voltage.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

One or more aspects of the present invention serve to reconcile inadequate voltage pseudo layer coding algorithms for isolation tanks of semiconductor devices. FIG. 1 is a schematic diagram illustrating at least part of an exemplary layout 100 for a semiconductor circuit. The layout may correspond, for example, to that of a mixed signal design. The layout 100 is formed upon a semiconductor substrate 102, wherein 'substrate' as used herein can include a semiconductor substrate, a semiconductor epitaxial layer deposited or otherwise formed on a semiconductor substrate and/or any other type of semiconductor body. For example, the semiconductor substrate 102 may comprise a semiconductor wafer (e.g., silicon, SiGe, or an SOI wafer) or one or more die on a wafer, and any epitaxial layers or other type semiconductor layers formed thereover or otherwise associated therewith.

In the illustrated example, an isolation ring 104 of n type material is formed in the substrate 102, and a p well 106 is formed within and isolated by the n type isolation ring 104. It will be appreciated that such isolation techniques are frequently used in mixed signal design layouts, and that the p well 106 may be referred to as an 'active area' since it is within this area that other semiconductor devices, elements, features, components, etc. will be formed, such as transistors and/or n or p type moat regions, for example. It will also be appreciated that sometimes every part of a circuit is isolated throughout an entire chip. Further, while the two regions 104, 106 are referenced herein, it is to be appreciated that one or more aspects of the present invention have application to any one or more types of regions (e.g., n well, p moat, n moat) arranged in any suitable manner and having any suitable configuration(s), and that areas 104, 106 are thus not intended to be constructed or interpreted in a limiting sense. Moreover, the isolation ring 104 is part of an isolation tank that is not merely a ring. Rather, the tank also includes a layer of buried n type material (NBL) 108 that generally underlies the well 106.

The n type isolation ring 104 and the NBL 108, and the p well 106 may be formed, for example, via respective implantation processes wherein an n type dopant (e.g., phosphorous (P), arsenic (As)) is implanted to form the n type isolation ring 104 and the NBL 108, and a p type dopant (e.g., boron (B)) is implanted to form the p well 106. In such implantation processes, the dopants are implanted at a dose (in atoms/cm$^2$) and at an associated energy (in keV). The degree of doping is thus, at least partially, dependent upon these parameters, as well as the duration of the implantation process, for example. By way of example, arsenic can be implanted at a dose of between about 1E12/cm$^2$ and about 1E13/cm$^2$ at an energy level of between about 100 keV and about 500 keV. Phosphorous (e.g., P31) can similarly be implanted at a dose of between about 1E12/cm$^2$ and about 1E13/cm$^2$ at an energy level of between about 50 keV and about 1000 keV, for example. Further, Boron (e.g., B11, BF2) can be implanted as a dose of between about 1E15/cm$^2$ and about 5E15/cm$^2$ at an energy level of between about 15 keV and about 150 keV to achieve a desired doping profile, for example. Additionally, such implantation processes can be followed by one or more heat treatments to activate the dopant atoms, for example.

By way of further example, lithographic techniques can be implemented to facilitate such implantation processes, where lithography generally refers to processes for transferring one or more patterns between various media. In lithography, a radiation sensitive resist coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example.

In any event, the n type isolation ring 104 may be operated at a first voltage v1 while the p well 106 may be operated at a second voltage v2, where the first and second voltages may or may not be same. Nevertheless, the substrate 102 is generally held a third voltage v3 that is different from the first and second voltages v1, v2. In mixed signal designs, for example, the n type isolation ring 104 and the p well 106 may be at relatively low voltage levels as compared to the voltage level v3 of the global substrate 102. In this situation, it is thus adequate to apply low voltage rules to the n type isolation ring 104 and the p well 106, while the area surrounding the n type isolation ring 104 should be tested against higher voltage rules. However, since the outer edges 110 of the n type isolation ring 104 abut the surrounding substrate 102, these edges are subjected to the higher potential of the third voltage level v3 and should therefore also be validated against higher voltage rules.

Unlike one or more aspects of the present invention, however, conventional pseudo layer application schemes do not make a distinction regarding area edges. Rather, area edges are conventionally subjected to the same voltage rules as the rest of the area. This can be problematic, for example, where the application of one or more low voltage rules may incorrectly indicate that there is adequate spacing between the n type isolation ring 104 and an adjacent isolation ring, structure, element, feature, circuit, etc. (not shown), where a lack of sufficient spacing between such regions may lead to 'premature breakdown' between these areas that are otherwise supposed to be electrically isolated from one another.

Figure 2:
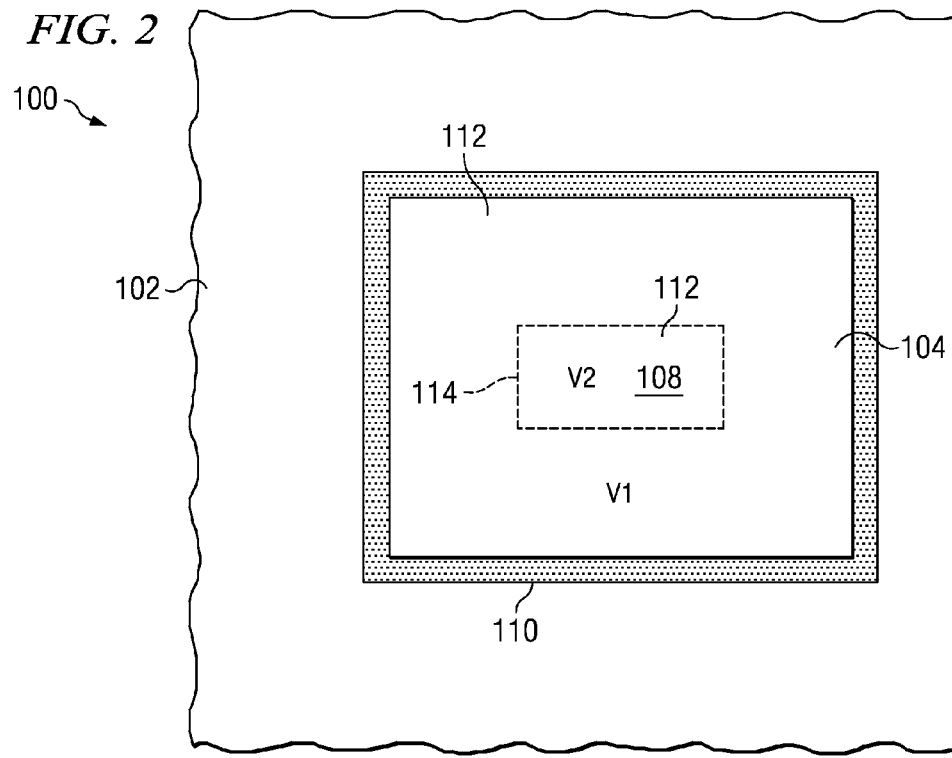
FIG. 2 is a schematic diagram illustrating an application of a verification methodology according to one or more aspects of the present invention wherein outer edges of an area are subjected to a first voltage rule since the outer edges are not covered by a pseudo layer.

Turning to FIG. 2, a schematic diagram illustrates application of an edge recognition based voltage pseudo layer verification methodology according to one or more aspects of the present invention. It will be appreciated that similar areas, regions, elements, features, components, etc. are presented in the different FIGS. referenced herein and that similar reference characters are accordingly used in the different FIGS. In FIG. 2, a pseudo layer 112 is coded so as to cover most of the n type isolation ring 104. In this manner, the pseudo layer 112 also covers all of the p well 106. The pseudo layer 112 does not, however, cover any of the outer edges 110 of the n type isolation ring 104. As such, the outer edges 110 are validated according to a first voltage rule (which may comprise one or more rules and/or a set of rules). Conversely, a second voltage rule (which may also comprise one or more rules and/or a set of rules) is applied to the portion of the n type isolation ring 104 (and the p well 106) covered by the pseudo layer 112.

According to one or more aspects of the present invention, the first voltage rule generally corresponds to a higher voltage rule (e.g., a 20, 30, 40 volt rule) which may or may not be a default rule, while the second voltage rule corresponds to a lower voltage rule (e.g., a 3, 5, 7 volt rule) or some other rule associated with the pseudo layer 112. In this manner, the majority of the n type isolation ring 104 (and the p well 106) can be validated with a lower voltage rule commensurate with the first voltage v1 (and the second voltage v2). Likewise, since the outer edges 110 of the n type isolation ring 104 are 'exposed' to the higher voltage v3 of the surrounding substrate 102, these edges 110 can tested with a higher voltage rule commensurate with the third voltage v3.

FIG. 3 is a block diagram illustrating an arrangement where a pseudo layer 112 is coded to cover all of the n type isolation ring 104 and the p well 106. In this situation, the p well 106 and all of the n type isolation ring 104, including its outer edges 110, are tested against a voltage rule associated with the pseudo layer 112, which may be a lower voltage rule, for example.

FIG. 4 is a block diagram illustrating a situation where a pseudo layer 112 is coded to generally form a ring that covers some of the n type isolation ring 104, including its outer edges 110, but not its inner edges 114 and not the p well 106. In this manner, the outer edges of the n type isolation ring 104 and the remaining portion of the n type isolation ring 104 covered by the pseudo layer 112 can be tested against a voltage rule corresponding to the pseudo layer. The p well 106, the inner edges 114 of the n type isolation ring 104 and the portion of the n type isolation ring 104 not covered by the pseudo layer can, on the other hand, be tested against a default voltage rule.

Figure 5:
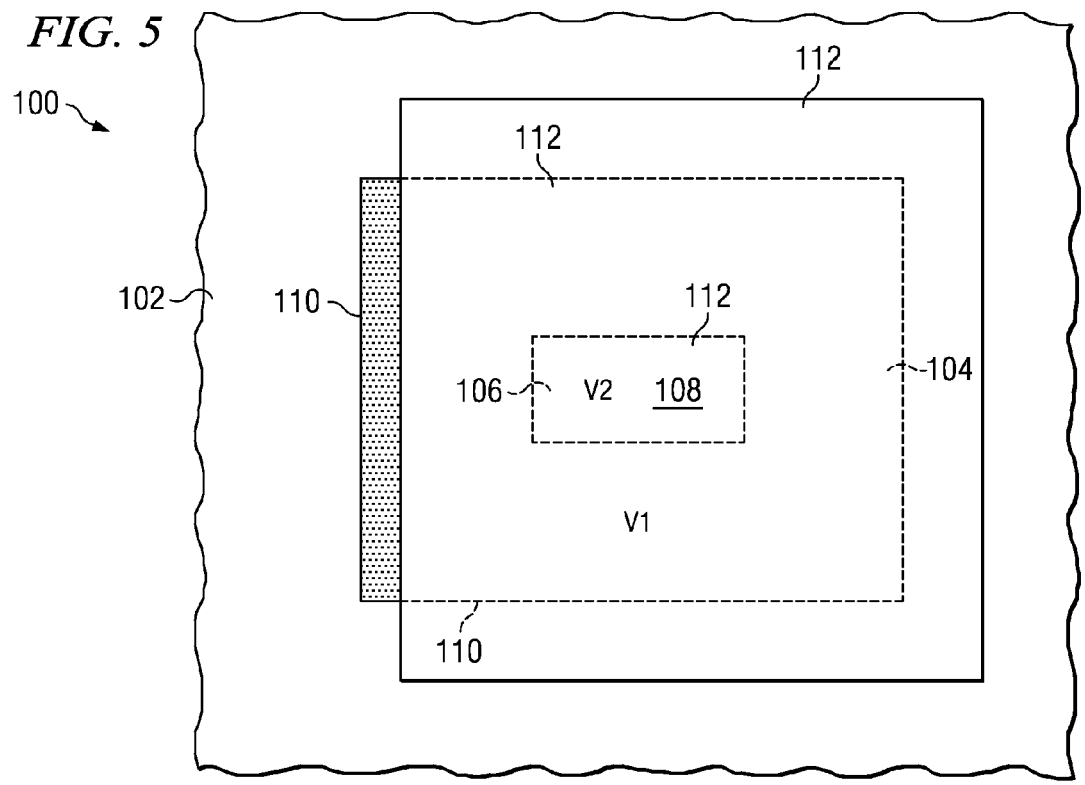
FIG. 5 is a schematic diagram illustrating an arrangement wherein less than all of the outer edges of an area are covered by a pseudo layer so that the edges are subjected to a first voltage rule according to one or more aspects of the present invention.

It will be appreciated that for a pseudo layer to cause a voltage rule to be applied to an edge of an area as described herein, the entire edge, or rather all segments of that edge, have to be covered by the pseudo layer according to one or more aspects of the present invention. This is depicted in FIG. 5 wherein a block diagram illustrates a pseudo layer 112 covering some, but not all segments of the outer edge 110 of an n type isolation ring 104. In this situation, a rule warning may flag and ask for one pseudo layer to cover the entire edge so that all segments of an edge are subjected to the same potential. Similarly, the outer edge 110 of the n type isolation ring 104 may be validated against a default voltage rule, such as a 40 volt rule (V40), for example, rather than a voltage rule associated with the pseudo layer 112.

Figure 6:
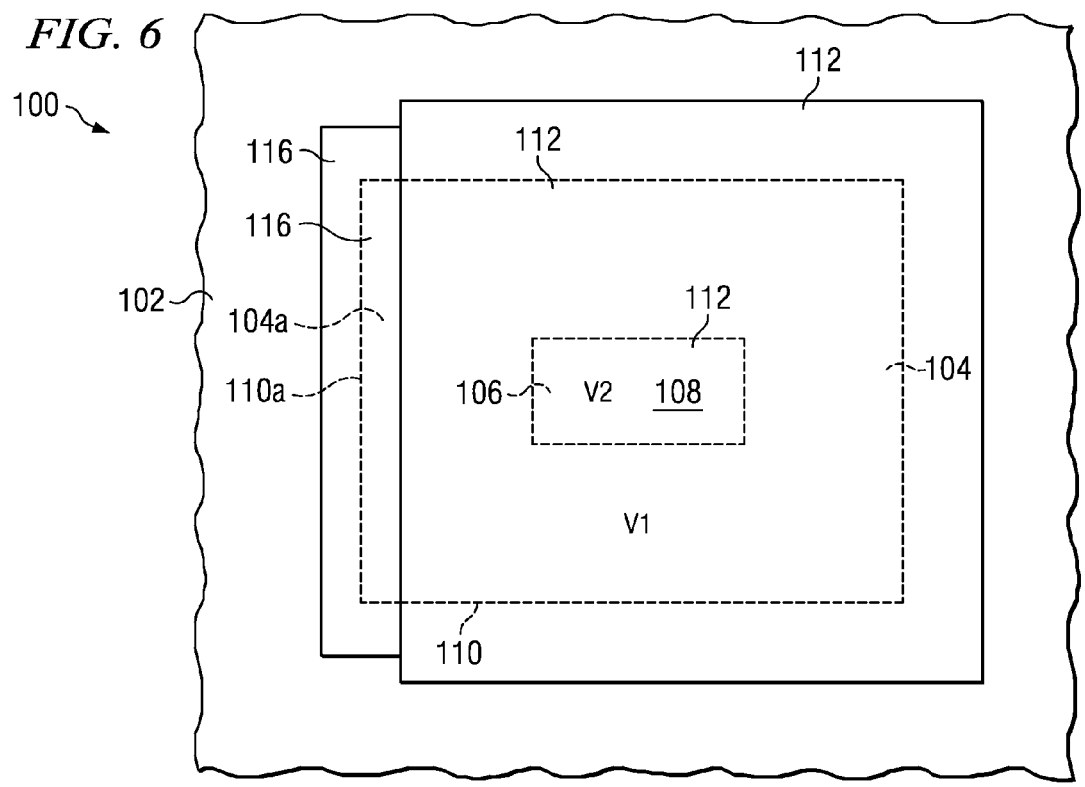
FIG. 6 is a schematic diagram illustrating a situation wherein a first pseudo layer covers some of the outer edges of an area and a second pseudo layer covers other outer edges of the area resulting in a coding rule violation in accordance with one or more aspects of the present invention.

Similarly, a single pseudo layer has to cover all segments of an edge of an area for that edge to be validated against a voltage rule other than a default voltage rule according to one or more aspects of the present invention. This is depicted in FIG. 6 wherein a block diagram illustrates a first pseudo layer 112 coded to cover a pwell 106, most of an n type isolating ring 104 and most of the outer edge 110 of the n type isolation ring 104. A second pseudo layer 116, however, covers the remaining portion 104a of the n type isolation ring 104 and the remaining segments 110a of the outer edge 110 of the n type isolation ring 104. In this situation, a voltage rule violation flag can be raised and/or a default voltage rule can be applied to the n type isolation ring 104 and the outer edge 110 of the n type isolation ring 104.

Figure 7:
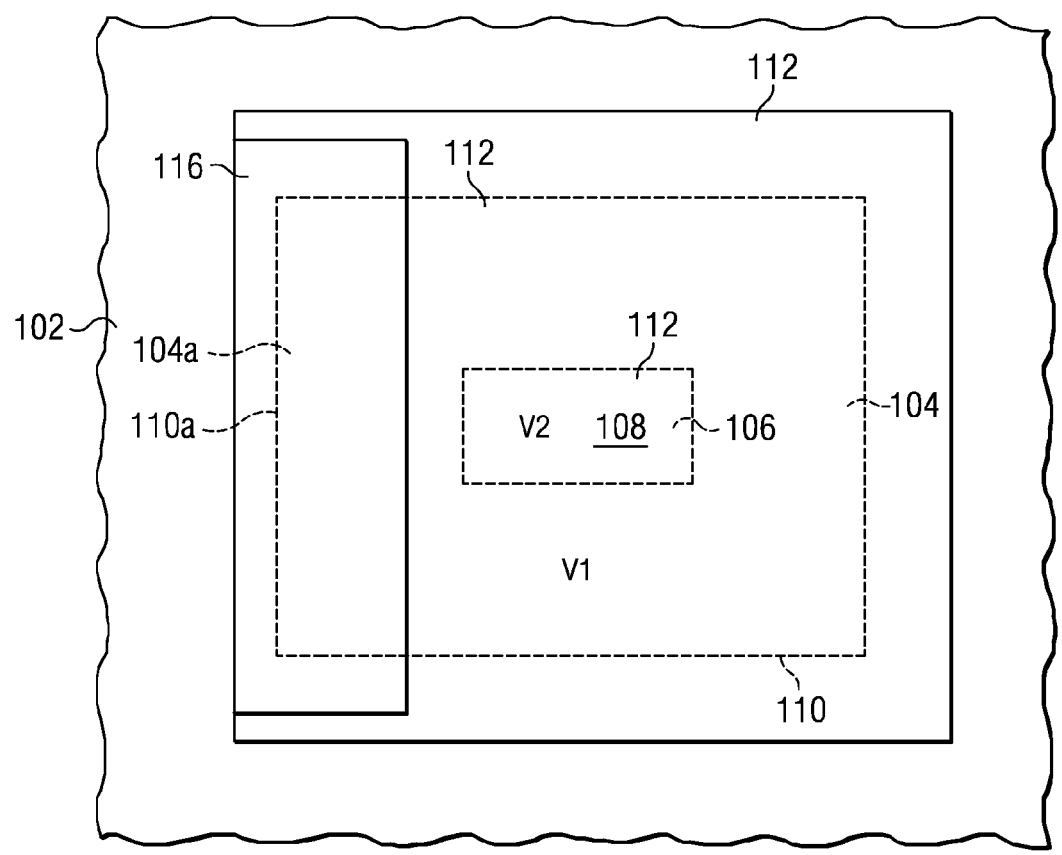
FIG. 7 is a schematic diagram illustrating a situation wherein first and second pseudo layers cover some of the same outer edges of an area resulting in a coding rule violation in accordance with one or more aspects of the present invention.

Further, even where a single pseudo layer covers all segments of an edge of an area, no part of that edge can be covered by another pseudo layer for a non-default voltage rule to be applied to that edge according to one or more aspects of the present invention. Basically, no more than one pseudo layer can be coded over an edge and/or pseudo layers can not be stacked on one another. This is presented in FIG. 7 where a block diagram illustrates a first pseudo layer 112 entirely covering a p well 106 and an n type isolation ring 104, including an outer edge of the n type isolation ring 104. A second pseudo layer 116, however, is also coded to (redundantly) cover a portion 104a of the n type isolation ring 104 and some segments 110a of the outer edge of the n type isolation ring 104. This redundancy can cause a voltage rule violation flag to be raised and/or a default voltage rule to be applied to the n type isolation ring 104 and the outer edge 110 of the n type isolation ring 104.

It will be appreciated that applying voltage design rules in accordance with one or more aspects of the present invention gives designers flexibility to use more compact design rules because the edge-based rules define the spacing appropriate for adjacent MOAT areas. In mixed signal designs, for example, very often the relative difference in potential between ring 104 and well 106 is small while 104 itself is at a high potential (e.g., 104 is at 30V, while 106 is at 23V). In this situation, coding the inner edge of ring 104 with V7 pseudo layer will validate small spacing rules. Additionally, it forces designers to examine active regions (e.g., well regions) and make a conscious choice on the application of voltage pseudo layers, thereby making it a safer implementation than conventional verification schemes.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising." It is also to be appreciated that elements and/or layers depicted herein are illustrated with particular dimensions relative to one another (e.g., layer to layer dimensions and/or orientations) for purposes of simplicity and ease of understanding, and that the actual dimensions of such elements/layers may differ substantially from that illustrated herein. Also, the term "exemplary" is merely meant to mean an example, rather than "the best". Further, it is also to be appreciated that the ordering of the acts described herein can be altered and that any such re-ordering is contemplated as falling within the scope of one or more aspects of the present invention.

What is claimed is:

1. A computer implemented method of applying voltage rules to at least some of a proposed semiconductor design layout, comprising:

automatically determining whether an edge of an area of the layout is covered by a pseudo layer;

automatically applying a first voltage dependent design rule to the area edge if the edge is not covered by the pseudo layer;

automatically applying a second voltage dependent design rule to the area edge if the edge is covered by the pseudo layer;

automatically applying the first voltage dependent design rule when less than all segments of the edge are covered by the pseudo layer; and at least one of automatically applying the first voltage dependent design rule when some segments of the edge are covered by a first pseudo layer and other segments of the edge are covered by a second pseudo layer, and automatically raising a voltage dependent design rule violation when some segments of the edge are covered by a first pseudo layer and other segments of the edge are covered by a second pseudo layer.

2. The method of claim 1, further comprising:

at least one of applying the first voltage dependent design rule when all segments of the edge are covered by a first pseudo layer and some segments of the edge are covered by a second pseudo layer, and raising a voltage dependent design rule violation when all segments of the edge are covered by a first pseudo layer and some segments of the edge are covered by a second pseudo layer.

3. The method of claim 2, further comprising:

at least one of applying the first voltage dependent design rule when a segment of the edge is covered by a first pseudo layer and a second pseudo layer, and raising a voltage dependent design rule violation when a segment of the edge is covered by a first pseudo layer and a second pseudo layer.

4. The method of claim 3, further comprising:

raising a voltage dependent design rule flag when any part of a first pseudo layer and any part of a second pseudo layer overlap one another.

5. The method of claim 4, wherein the first voltage rule comprises at least one of a higher voltage rule and a default voltage rule.

6. The method of claim 5, wherein the second voltage rule comprises at least one of a lower voltage rule and a voltage rule corresponding to the pseudo layer.

7. The method of claim 6, wherein the layout comprises an isolation area and a well area within the isolation area.

8. The method of claim 7, wherein the isolation area and the well area are formed on a semiconductor substrate.

9. The method of claim 8, wherein the isolation area and the well area are at first and second voltages, respectively and the substrate is at a third voltage that is higher than the first and second voltages.

10. The method of claim 9, wherein the edge comprises an outer edge of the isolation area.

11. The method of claim 10, wherein the first and second voltage dependent design rules pertain to whether there is sufficient separation between areas formed on the substrate.

12. The method of claim 11, wherein the layout corresponds to that of a mixed signal design.

13. The method of claim 12, wherein the first voltage rule corresponds to at least one of a 20 volt rule, a 30 volt rule, and a 40 volt rule.

14. The method of claim 13, wherein the second voltage rule corresponds to at least one of a 3 volt rule, a 5 volt rule, and a 7 volt rule.

15. The method of claim 14, further comprising:

coding a pseudo layer to cover at least some of the isolation area, but not the outer edge of the isolation area.

16. A computer implemented method of validating at least some of a proposed semiconductor design layout, comprising:

automatically applying a first voltage dependent design rule to an edge of an area of the layout if the edge is not covered by a pseudo layer; and automatically applying a second voltage dependent design rule to the area edge if the edge is covered by the pseudo layer;

wherein at least one of the first voltage rule comprises at least one of a higher voltage rule and a default voltage rule, and the second voltage rule comprises at least one of a lower voltage rule and a voltage rule corresponding to the pseudo layer.

17. The method of claim 16, wherein the layout corresponds to that of a mixed signal design and comprises an isolation area and a well area within the isolation area, and wherein the edge comprises an outer edge of the isolation area.

* * * * *